United States Patent [19]
Dietz

[11] 4,034,263
[45] July 5, 1977

[54] GATE DRIVE CIRCUIT FOR THYRISTOR DEFLECTION SYSTEM

[75] Inventor: Wolfgang Friedrich Wilhelm Dietz, New Hope, Pa.

[73] Assignee: RCA Corporation, New York, N.Y.

[22] Filed: Sept. 12, 1975

[21] Appl. No.: 612,733

[52] U.S. Cl. ............................... 315/408; 315/410
[51] Int. Cl.² .................... H01J 29/70; H01J 29/76
[58] Field of Search .......................... 315/408, 410

[56] References Cited
UNITED STATES PATENTS

| | | | |
|---|---|---|---|
| 3,452,244 | 6/1969 | Dietz | 315/408 |
| 3,784,871 | 1/1974 | Vacher | 315/408 |
| 3,819,979 | 6/1974 | Truskalo | 315/408 |
| 3,881,135 | 4/1975 | Dietz | 315/408 |

*Primary Examiner*—Maynard R. Wilbur
*Assistant Examiner*—T. M. Blum
*Attorney, Agent, or Firm*—Eugene M. Whitacre; Paul J. Rasmussen

[57] ABSTRACT

A thyristor gate drive circuit includes a unidirectional current conducting device coupled to charge a capacitor with single polarity signals. The discharge of the capacitor is controlled so that polarity changes in the drive waveform do not effect the polarity of the drive signal coupled to the gate.

8 Claims, 9 Drawing Figures

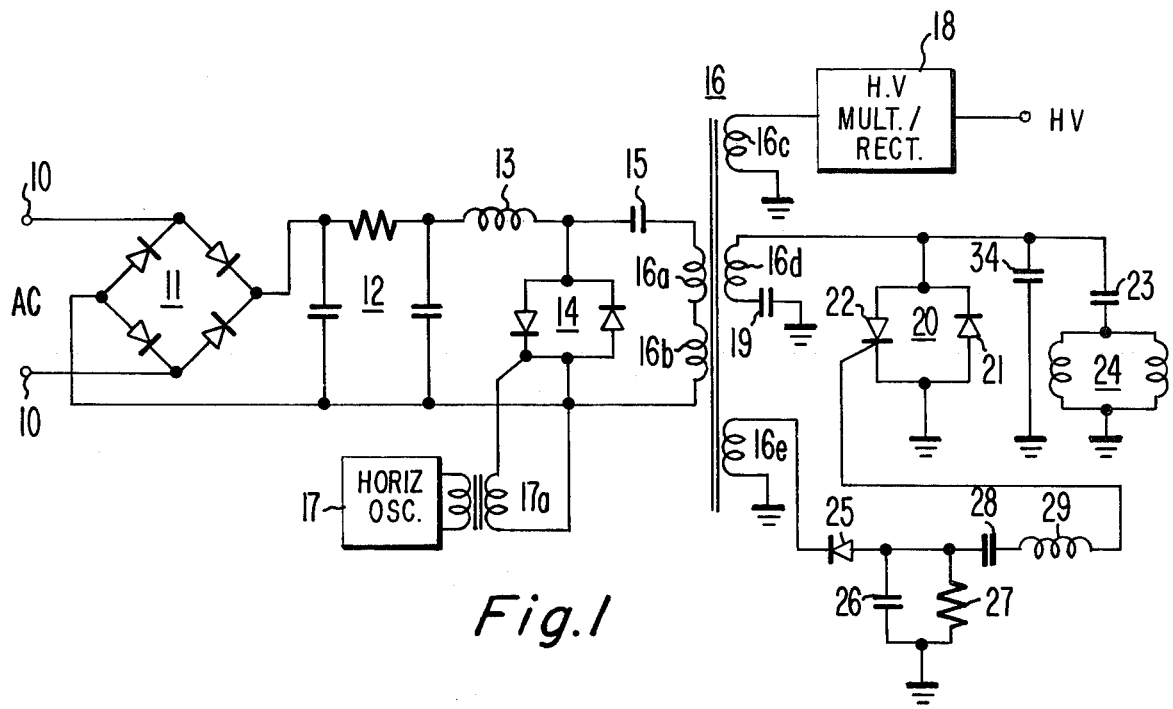
Fig.1
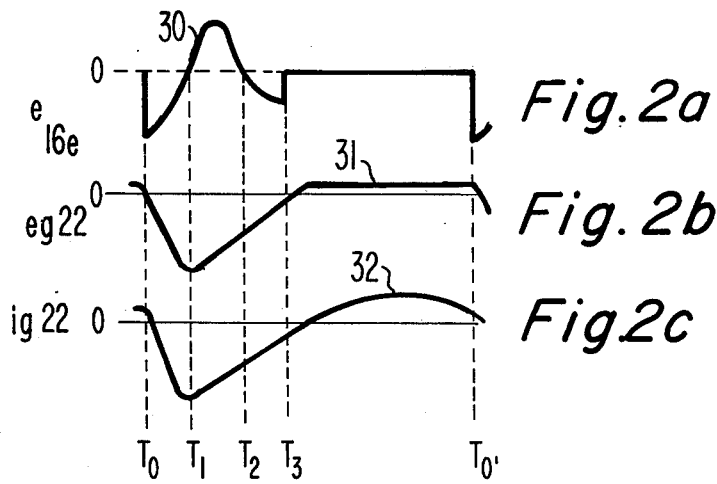
Fig.2a
Fig.2b
Fig.2c
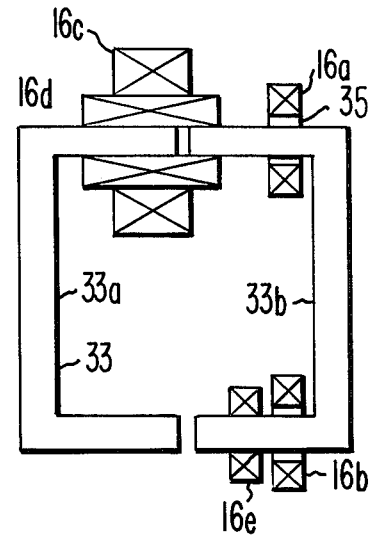
Fig.3

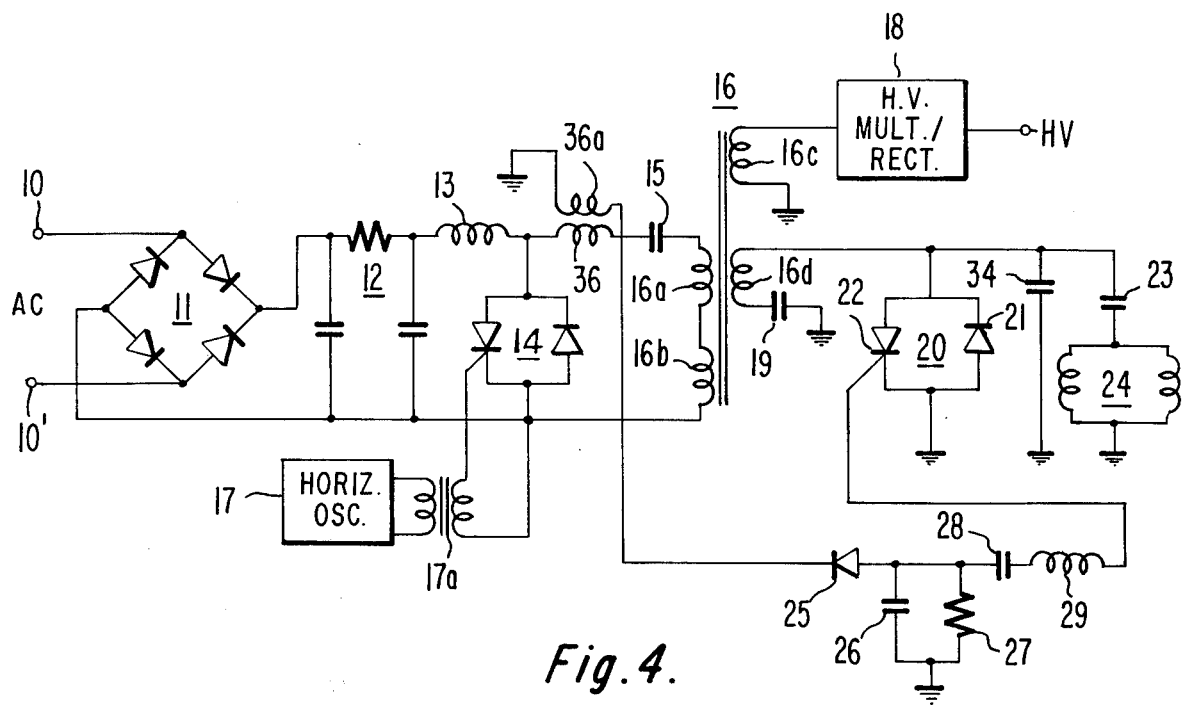
Fig.4.
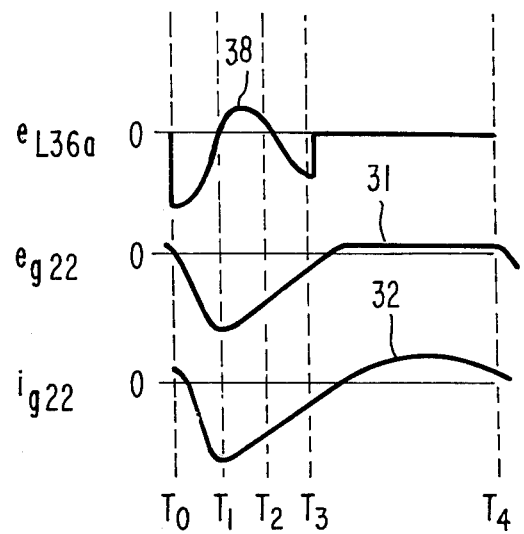
Fig.5a.
Fig.5b.
Fig.5c.

GATE DRIVE CIRCUIT FOR THYRISTOR DEFLECTION SYSTEM

BACKGROUND OF THE INVENTION

This invention relates to gate drive circuit for a thyristor deflection system.

It is common to derive the trace thyristor gate drive signal from a tap or winding associated with the input reactor as disclosed in U.S. Pat. No. 3,452,244. However, when certain types of regulators, such as controlled switching devices in series with the input reactor are used, the waveforms of the reactor are no longer suitable for direct use as drive signals It has been common practice to manufacture television receivers without using a separate line transformer for isolating the receiver chassis from the alternating current source in order to save the cost of such a transformer. In such a situation, the receiver chassis will be floating, that is, tied to the alternating current line. With suitable precautions taken to ensure that the receiver chassis is insulated so that the user will not come into electrical contact with the chassis there is vitually no danger of electrical shock to the user. However, with the advant of devices such as video recorders which may be adapted to record and playback signals with the television receiver it is necessary to isolate the receiver from the alternating current line so that the recording unit may be electrically connected to the receiver chassis ground.

In copending United States Application Ser. No. 460,648, entitled "Alternating Current Line Voltage Supply Isolation Using Deflection System Output Transformer", several arrangements are disclosed for utilizing the horizontal deflection output transformer for achieving line isolation. The disclosed arrangements are suitable for use in deflection systems including the dual bi-directional conducting thyristor deflection system described in U.S. Pat. No. 3,452,244. With such arrangement either the secondary circuits of the output transformer may be referenced to chassis ground or also the trace switch may also be referenced to chassis ground thereby minimizing the insulation necessary to separate the viewer from the chassis while eliminating the requirement of a separate line isolation transformer.

Of concern in any isolation scheme including that described in the aforementioned application is the number of connections between the isolated and non-isolated portions of the receiver. From a point of view of safety and lack of complexity, it is desirable to minimize the number of these connections.

SUMMARY OF THE INVENTION

A drive circuit for a thyristor deflection system includes a unidirectional current conducting device adapted to be coupled to a signal source associated with the commutating portion of the deflection system for charging capacitive means with a single polarity current. The discharge of the capacitor is controlled such that any polarity changes in the signal does not change the predetermined characteristics of the gate drive current obtained from the circuit.

In one embodiment, an isolated drive circuit for a two-switch deflection system includes an energy storage means, a first controlled switch and a primary winding of an output transformer adapted to be coupled to a non-isolated power supply. A first secondary winding is coupled to an energy storage means and a second controlled switch, which switch provides for alternating deflection current in a deflection winding coupled to the second switch. A second secondary winding is coupled through a unidirectional current conducting device to supply energy to a waveshaping network which in term drives the second switch. The first and second secondary windings are returned to reference potential for isolation of all circuitry coupled thereto from the non-isolated power supply.

In another embodiment of an isolated drive circuit, one terminal of a unidirectional current conducting device is coupled to a winding of the commutating coil in the commutating circuit of the aforementioned two-thyristor deflection system for providing isolation of the drive signal source. The other terminal of the device is coupled to a capacitor for charging it with a single polarity current. The capacitor is also coupled to the gate electrode of a thyristor in the trace portion of the deflection system for controlling conduction thereof.

A more detailed description of the invention is given in the following description and accompanying drawings of which:

FIG. 1 is a block and schematic diagram of an isolated deflection system embodying a gate drive circuit according to the invention;

FIGS. 2a-2c illustrate voltage and current waveforms obtained in the system of FIG. 1;

FIG. 3 illustrates a winding arrangement of an output transformer suitable for use in the system of FIG. 1;

FIG. 4 is a block and schematic diagram of another isolated deflection system embodying a gate drive circuit according to the invention; and FIGS. 5a-5c illustrate voltage and current waveforms obtained in the system of FIG. 4. Description of the Invention A pair of terminals 10, adapted to be coupled to an alternating current power source are coupled to a bridge rectifier 11 which provides a direct voltage which is filtered and smoothed by filter network 12. The direct current obtained from filter network 12 is coupled to an energy storing input reactor 13 serially coupled to a first bi-directional conducting switch 14 comprising an SCR and diode coupled in parallel for opposite directions of conductivity. A horizontal oscillator 17 provides gate drive pulses coupled through a transformer 17a for the SCR of switch 14. Coupled in parallel with switch 14 are commutating capacitor 15 and two primary windings segements 16a and 16b of a horizontal output and high voltage transformer 16. It is noted that all of the elements so far recited are not referenced to a point of reference potential but are floating with the alternating current line. It is to be understood, however, that horizontal oscillator 17 may be transformer coupled to switch 14 so that the oscillator is isolated from the first portion of the deflection system.

On the secondary side of transformer 16 a tertiary winding 16c provides horizontal retrace pulses for multiplication and rectification by a high voltage multiplier and rectifier assembly 18 for providing a high voltage direct current suitable for use as the energy source for the ultor electrode of a television picture tube.

A second bi-directional conducting switch 20 comprising a diode 21 and an oppositely poled SCR 22 is coupled in parallel with a retrace capacitor 34 and with a series connected S-shaping capacitor 23 and a pair of horizontal deflection coils 24. Switch 20 is coupled through a secondary winding 16d and a trace capacitor 19 to reference potential.

The principle of operation of the above-described deflection system is similar to that described in U.S. Pat. No. 3,452,244 and the copending application in that the commutating switch 14 is periodically controlled to store energy in an input reactor 13 to switch this energy through capacitor 15 to energize primary windings 16a and 16b. The energy in the primary commutating circuit including input reactor 13 and capacitor 15 is transferred via primary windings 16a and 16b to the secondary winding 16d and is stored in capacitor 23 and winding 24 during each retrace interval. The leakage inductance of the transformer is utilized as the inductance normally provided by a commutating coil as taught in the copending application by loosely coupling the windings 16a and 16b and 16d.

The trace SCR 22 is gated by a suitable waveform obtained from transformer winding 16e during the time commutating switch 14 is opened. The waveform obtained at winding 16e is illustrated by the voltage waveform 30 of FIG. 2a, the portion $T_0 - T_3$ representing the commutating interval. The initial negative voltage portion of voltage waveform 30, from $T_0$ to $T_1$ causes diode 25 to conduct and charge capacitor 26 negative at its top terminal relative to its grounded terminal. During the remainder of the deflection interval i.e., $T_1 - T_0'$ capacitor 26 discharges partially through resistor 27, capacitor 28 and inductor 29 for providing hold-off voltage and then positive drive current for the gate electrode of trace switch 22. Resistor 27 is chosen large enough so that the discharge time constant of capacitor 26 is long enough that the positive and negative excursions of voltage waveform 30 at $T_1 - T_2$ and $T_2 - T_3$ do not affect the waveforms 31 and 32. Capacitor 28 and inductor 29 form a series resonant circuit which couples the energy from capacitor 26 to the gate electrode such that the respective gate voltage and current waveforms are as illustrated by waveforms 31 and 32 of FIGS. 2b and 2c. The negative portion of these waveforms hold SCR 22 off once it has been commutated off and the positive portion enables SCR 22 for conduction during the second half of the trace interval.

It is noted that the current waveform 32 reaches a peak at approximately the midpoint between $T_3 - T_0'$ due to the resonance of capacitor 28 and inductor 29 so as to enable SCR 22 for conduction at that time when the deflection current in windings 24 reverses and diode 21 becomes reverse biased.

By obtaining the gate drive voltage from winding 16e which is referenced to ground potential a suitable isolated gate drive is provided for trace SCR 22.

FIG. 3 illustrates an arrangement of the windings of transformer 16. Two C-core halves 33a and 33b are placed to provide an air gap around the core is placed the split primary windings 16a and 16b which are insulated from core 33 by a bobbin of suitable insulating material 35. Secondary winding 16d is wound around core 33 and is loosely coupled to primary windings 16a and 16b and tertiary winding 16c is wound around the secondary winding 16d. Winding 16e is isolated from the rest of the windings and is in proximity to primary winding 16b. In this manner the respective primary and secondary windings are isolated from each other electrically and still provide the required secondary voltages for operation of the deflection system.

FIG. 4 is a block and schematic diagram of an isolated thyristor deflection system embodying a gate drive circuit according to the invention. With the exception of the source of drive waveforms for the gate circuit, the circuit of FIG. 5 is identical to the circuit of FIG. 1 with like elements bearing the same reference numerals.

In FIG. 5 a commutating coil 36 has been inserted between input reactor 13 and commutating capacitor 15 in the primary or commutating portion of the deflection system. A winding 36a of inductor 36 has one terminal grounded to the chassis ground and the other coupled to the cathode of diode 25 of the waveshaping network. By comparing voltage waveform 38 obtained at winding 36a with voltage waveform 30 of FIG. 2a it can be seen that the positive-going portion of waveform 38 is less than that of waveform 30, waveform 30 being obtained from secondary winding 16e of FIG. 1. Waveform 38 is more desirable than voltage waveform 30 because it is the initial negative portion from $T_0$ to $T_1$ that charges capacitor 26 negative with respect to ground. The smaller the negative portion from $T_2$ to $T_3$, the easier it is to control the discharge of capacitor 26.

The use of commutating coil 36 eliminates the need for transformer winding 16e utilized in FIG. 1. With the use of discrete commutating coil 36 in FIG. 5, primary winding 16a and 16b may be tightly coupled to secondary winding 16d because no large leakage inductance is required to simulate the inductance of the commutating coil as in FIG. 1. With tightly coupled primary secondary wndings as in FIG. 5, the circuit consumes somewhat less power than the loosely coupled circuit of FIG. 1 and also radiates less energy at the horizontal deflection frequency. By comparing waveforms 31 and 32 of FIGS. 5b and 5c respectively, to the corresponding voltage and current gate drive waveforms in FIGS 2b and 2c respectively, it can be seen that these waveforms are essentially similar.

In both the FIG. 1 and FIG. 5 embodiments utilizing isolated chassis operation the use of diode 25 and the controlled discharge of capacitor 26 by selection of the value of resistor 27 enables the use of an alternating current voltage source such as winding 16e or winding 36a and still provide the properly poled voltage and current drive waveforms for the gate of trace SCR 22.

Although the gate drive circuit according to the invention advantageously may be used with isolated deflection systems as illustrated in FIGS. 1 and 5, it is to be understood that the gate drive circuit is equally applicable for use in non-isolated deflection systems or in deflection systems wherein the voltage waveform developed across the input reactor is not suitable for driving the gate of the trace switch because of the type of regulation such as a series regulator in series with the input reactor which would result in a chopped voltage waveform.

What is claimed is:

1. A gat drive circuit for a thyristor deflection system, comprising:
    a commutating circuit including a periodically controlled first switch for producing alternating current in said commutating circuit;
    a trace circuit including a periodically controlled second switch coupled to said commutating circuit for storing energy in a deflection winding during a retrace interval of every deflection cycle; and
    a gate drive circuit including a unidirectional current conducting device coupled to receive alternating current signals from said commutating circuit, a capacitor coupled to be charged by unidirectional current from said device, said capacitor being coupled to control the conduction state of said second switch, and means for controlling the discharge time of said capacitor for rendering it unresponsive to polarity changes in said alternating current signals within each of said deflection cycles.

2. A gate drive circuit according to claim 1 wherein said means includes an impedance coupled in parallel with said capacitor.

3. An isolated gate drive circuit for a two-switch deflection system, comprising:
   a series connected first periodically controlled switching and first energy storage means adapted to be coupled to a floating power supply;
   a first winding of a transformer coupled in parallel with said first switch;
   a second periodically controlled switching means coupled in parallel with a deflection winding;
   a second winding of said transformer and second energy storage means coupled to said second switching means;
   a third winding of said transformer; and
   waveshaping means coupled to said third winding and to said second switching means for controlling conduction thereof in response to alternating current in said first winding caused by operation of said first switching means, said second and third windings being coupled to a point of reference potential.

4. A gate drive circuit for a thyristor deflection system, comprising:
   a commutating circuit including a periodically controlled first switch for producing alternating current in said commutating circuit;
   a trace circuit including a periodically controlled second switch coupled to said commutating circuit for storing energy in deflection winding during a retrace interval of every deflection cycle; and
   a gate drive circuit including a unidirectional current conducting device coupled to receive alternating current signals from said commutating circuit, a capacitor coupled to be charged by unidirectional current from said device, said capacitor being coupled to control the conduction state of said second switch, and an impedance coupled in parallel with said capacitor for controlling the discharge time of said capacitor for rendering it unresponsive to polarity changes in said alternating current signals within each of said deflection cycles and a resonant circuit coupled between said capacitor and said second switch for waveshaping the current for controlling said switch.

5. A gate drive circuit according to claim 4 wherein said commutating circuit is floating with respect to a point of reference potential and which includes a commutating inductance, a winding of which is coupled to said point of reference potential and to said device for providing said alternating current signals thereto.

6. An isolated gate drive circuit for a two-switch deflection system, comprising:
   a series connected first periodically controlled switching and first energy storage means adapted to be coupled to a floating power supply;
   a first winding of a transformer coupled in parallel with said first switch;
   a second periodically controlled switching means coupled in parallel with a deflection winding;
   a second winding of said transformer and second energy storage means coupled to said second switching means;
   a third winding of said transformer; and
   waveshaping means including a unidirectional current conducting device serially coupled to a resonant circuit between said third winding and said second switching means for coupling voltage of only one polarity to said waveshaping means for controlling conduction of said second switching means in response to alternating current in said first winding caused by operation of said first switching means, said second and third windings being coupled to a point of reference potential.

7. An isolated gate drive circuit according to claim 6 wherein capacitance means is coupled between the junction of said device and said resonant circuit and reference potential.

8. An isolated gate drive circuit according to claim 7 wherein resistance means are coupled in parallel with said capacitance means for controlling the discharge of said capacitance means during each deflection cycle.

* * * * *